(12) United States Patent (10) Patent No.: US 7,746,166 B2
Groiss et al. (45) Date of Patent: Jun. 29, 2010

(54) INTEGRATED CIRCUIT INCLUDING FILTER CIRCUIT ARRANGEMENT

(75) Inventors: Stefan Hermann Groiss, Villach-Landskron (AT); Elmar Bach, Villach (AT)

(73) Assignee: Infineon Technologies AG, Neubiberg (DE)

(*) Notice: Subject to any disclaimer, the term of this patent is extended or adjusted under 35 U.S.C. 154(b) by 231 days.

(21) Appl. No.: 11/948,391

(22) Filed: Nov. 30, 2007

(65) Prior Publication Data

US 2009/0167426 A1 Jul. 2, 2009

(51) Int. Cl.
*H03K 5/00* (2006.01)

(52) U.S. Cl. .......................... 327/553; 327/552; 327/554
(58) Field of Classification Search .......... 327/551–559
See application file for complete search history.

(56) References Cited

U.S. PATENT DOCUMENTS

| 6,052,001 | A  | * | 4/2000  | Cho et al. ................. 327/103 |
| 6,822,505 | B1 | * | 11/2004 | Palaskas et al. ............ 327/551 |
| 7,061,309 | B2 | * | 6/2006  | Kato et al. ................. 327/553 |

* cited by examiner

*Primary Examiner*—Dinh T. Le
(74) *Attorney, Agent, or Firm*—Dicke, Billig & Czaja, PLLC (57) ABSTRACT

An integrated circuit includes a filter circuit that has at least one active device, wherein the active device has adjustable transconductance.

3 Claims, 3 Drawing Sheets

INTEGRATED CIRCUIT INCLUDING FILTER CIRCUIT ARRANGEMENT

BACKGROUND

In electronic devices such as semiconductor devices, in particular in corresponding analog and/or digital integrated circuits, memory devices, signal-processing systems etc., filter circuit arrangements, such as high and/or low pass filter circuit arrangements are frequently used.

A high pass is a filter circuit arrangement that transmits signals with relatively high frequencies substantially without modification. Further, with signals with relatively low frequencies in general attenuation and, as a rule, a phase lead is effected.

As compared to this, a low pass is a filter circuit arrangement in which signals with relatively low frequencies are transmitted substantially without modification; with signals with relatively high frequencies, attenuation and, as a rule, a phase lag is effected.

Passive high and/or low pass filter circuit arrangements may include one or several resistors and, as energy storage device, one or more capacitive devices and/or one or more inductive devices.

As compared to this, active filter circuit arrangements generally include, in addition to passive devices such as resistors and capacitors, one or more active devices, such as operational amplifiers.

For configuring the properties of a filter circuit arrangement such as the respective cutoff frequency, etc. switchable capacitors may be used. Alternatively or additionally, for configuring the properties of a filter circuit arrangement, the transconductance of active devices, e.g., transistors in respective operational amplifiers, etc. may be suitably adjusted, etc. However, changing a respective filter configuration due to relatively long transient times of control loops included in the respective filter circuit arrangement may last relatively long. For these or other reasons, there is a need for the present invention.

SUMMARY

According to an embodiment of the invention, a filter circuit arrangement is provided including at least one active device with adjustable transconductance.

Further features and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
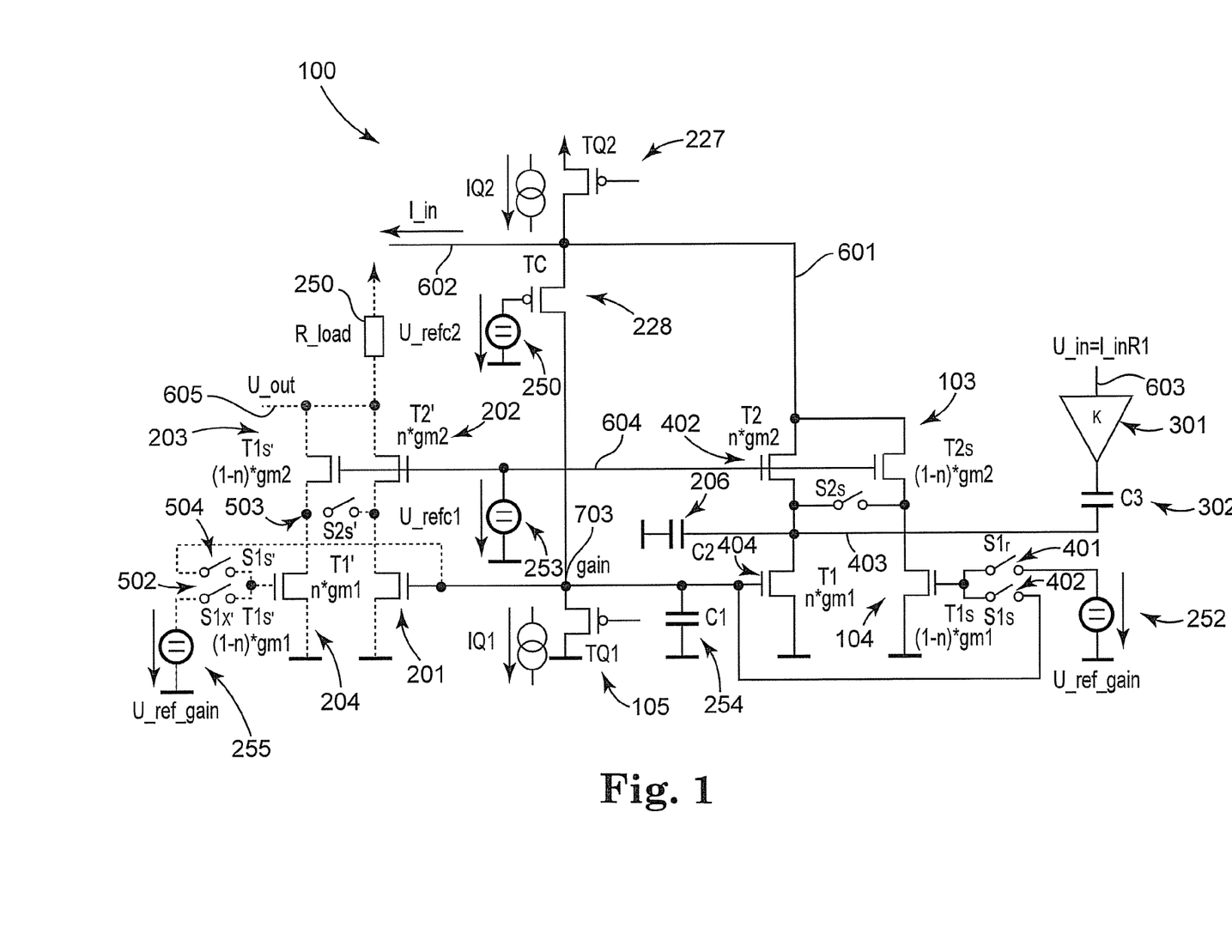
FIG. 1 illustrates a schematic, exemplary representation of a filter circuit arrangement in accordance with an embodiment of the invention.

FIG. 1 illustrates a schematic, exemplary representation of a filter circuit arrangement 100 in accordance with an embodiment of the invention.

As results from FIG. 1, the filter circuit arrangement 100 includes a plurality of n-channel field effect transistors 101, 102, 103, 104, 105, and optionally, 201, 202, 203, 204.

Further, the filter circuit arrangement 100 includes several p-channel field effect transistors 227, 228, a plurality of capacitors 254, 206, 302, and a linear amplifier device 301.

In addition, and as will be described in further detail below, the filter circuit arrangement 100 includes a plurality of switches 401, 402, 403, 501, 502, 503.

As is illustrated in FIG. 1, the drain of the n-channel field effect transistor 102 is connected to the drain of the n-channel field effect transistor 103. Further, the drain of the n-channel field effect transistor 102 and the drain of the n-channel field effect transistor 103 are connected via a line 601 with the drain of the p-channel field effect transistor 227, with the source of the p-channel field effect transistor 228, and with a current input line 602. Further, the source of the p-channel field effect transistor 227 is connected to a supply voltage.

The drain of the p-channel field effect transistor 228 is connected with the drain of the n-channel field effect transistor 105, the source of which is connected to ground.

Further, the drain of the n-channel field effect transistor 105 is connected with the gate of the n-channel field effect transistor 201, the gate of the n-channel field effect transistor 101, and the capacitor 254, which is also connected to ground.

As is also illustrated in FIG. 1, the source of the n-channel field effect transistor 102 is connected with the drain of the n-channel field effect transistor 101, the capacitor 302, the first connection of the switch 403, and the capacitor 206, which also is connected to ground.

Further, the source of the n-channel field effect transistor 103 is connected with the drain of the n-channel field effect transistor 104, and to the second connection of the switch 403.

The gate of the n-channel field effect transistor 104 is connected to the first connection of the switch 401, and to the first connection of the switch 402. Further, the source of the n-channel field effect transistor 104 is connected to ground.

Correspondingly similar, the source of the n-channel field effect transistor 101 is connected to ground.

The second connection of the switch 402 is connected to the gate of the n-channel field effect transistor 101, and hence, also to the capacitor 254, the drains of the field effect transistors 105, 228, and the gate of the field effect transistor 201.

In addition, the second connection of the switch 401 is biased to a (constant or substantially constant) voltage U_ref_gain by a voltage source 252 (see remarks below).

Further, the capacitor 302 is connected to an output of the linear amplifier device 301, the input of which is connected to a line 603.

As is further illustrated in FIG. 1, the gate of the n-channel field effect transistor 103 is connected to the gate of the n-channel field effect transistor 102, which via a line 604 is connected to the gate of the n-channel field effect transistor 202, and to the gate of the n-channel field effect transistor 203.

In addition, the line 604 is biased to a (constant) voltage U_refc1 by using a voltage source 253. Furthermore, the gate of the p-channel field effect transistor 228 is biased to a (constant) voltage U_refc2 by using a voltage source 251.

As is also illustrated in FIG. 1, the source of the n-channel field effect transistor 202 is connected with the drain of the n-channel field effect transistor 201, and to the first connection of the switch 503.

Further, the source of the n-channel field effect transistor 203 is connected with the drain of the n-channel field effect transistor 204, and to the second connection of the switch 503.

The gate of the n-channel field effect transistor 204 is connected to the first connection of the switch 501, and to the first connection of the switch 502. Further, the source of the n-channel field effect transistor 204 is connected to ground. Correspondingly similar, the source of the n-channel field effect transistor 201 is connected to ground.

The second connection of the switch 501 is connected to the gate of the n-channel field effect transistor 201, and hence, also to the capacitor 254, the drains of the field effect transistors 105, 228, and the gate of the field effect transistor 101.

In addition, the second connection of the switch 502 is biased to the above (constant or substantially constant) voltage U_ref_gain by a voltage source 255 (see remark below).

As is further illustrated in FIG. 1, the drain of the n-channel field effect transistor 202 is connected to the drain of the n-channel field effect transistor 203. Further, the drain of the n-channel field effect transistor 202 and the drain of the n-channel field effect transistor 203 are connected with a voltage output line 605, and via a load resistor 250 to the above supply voltage.

As indicated in FIG. 1, by use of the amplifier device 301, a voltage U_in present at the line 603, i.e., the voltage U_in present at the input of the amplifier device 301 is amplified by the amplifier device 301 by a respective amplifying factor k, such that a voltage of k×U_in is put out at its output, and hence, is fed to the capacitor 302.

Further, in the present embodiment, the voltage U_in present at the line 603, i.e., the voltage U_in representing the input of the amplifier device 301 is chosen to be R1 times I_in, i.e., R1 times an input signal current I_in present at the above current input line 602 (such that U_in=I_in×R1).

As is illustrated in FIG. 1, by use of the filter circuit arrangement 100, the input current I_in fed to the filter circuit arrangement 100 via the current input line 602, and representing the input of the filter circuit arrangement 100 is converted into a respective output voltage U_out that can be tapped at the above voltage output line 605, and representing the output of the filter circuit arrangement 100.

In the filter circuit arrangement 100, the p-channel field effect transistor 228 serves as a cascode to keep the node connected with the line 601/the drains of the n-channel field effect transistors 102, 103 on a predefined potential.

Further, the p-channel field effect transistor 227 acts as a current source (current IQ2). Such a current source may in alternative embodiments be designed differently than illustrated in FIG. 1.

As results further from FIG. 1, the n-channel field effect transistor 105 acts as a current sink (current IQ1). Hence, the pairs of n-channel field effect transistors 102, 103 or 101, 104, respectively are thus flown through by a current that results from the difference between the above-mentioned currents IQ2 and IQ1 (IQ2−IQ1). A current sink as provided by the transistor 105 may in alternative embodiments be designed differently than illustrated in FIG. 1.

As becomes clear from what was said above, the above transistors 201, 202, 203, 204 e.g., serve to couple out respective signals from the circuit arrangement 100, in particular, e.g., the above output voltage U_out.

The circuit arrangement 100 may be operated in several different frequency bands.

If the circuit arrangement 100 is to be operated in a first frequency band including relatively high frequencies ("high frequency band"), the (total/effective) transconductance of active devices, e.g., transistors in the circuit arrangement 100 may be adjusted, e.g., may be made higher.

For this purpose, e.g., the switches 402, 403, 501, 503 are closed, and the switches 401, 502 are opened.

In this case, the n-channel field effect transistors 101, 104, as well as the n-channel field effect transistors 102, 103, as well as the n-channel field effect transistors 201, 204, as well as the n-channel field effect transistors 202, 203 are connected in parallel, respectively.

In this case, and as will be described in further detail below, the n-channel field effect transistor 101 together with the n-channel field effect transistor 104 has a (total/effective) transconductance of gm1. Correspondingly similar, also, the n-channel field effect transistor 201 together with the n-channel field effect transistor 204 has a (total/effective) transconductance of gm1. Further, the n-channel field effect transistor 102 together with the n-channel field effect transistor 103 has a (total/effective) transconductance of gm2. Correspondingly similar, also, the n-channel field effect transistor 202 together with the n-channel field effect transistor 203 has a (total/effective) transconductance of gm2.

The current control loop e.g., including the transistor 101 in parallel to the transistor 104, the transistor 102 in parallel to the transistor 103, the above cascode transistor 228, the above current sink, and the above current source controls the current through the transistor 101 in parallel to the transistor 104, and the transistor 102 in parallel to the transistor 103 so that the above current IQ2−IQ1 flows through the pairs of transistors 102, 103 and 101, 104, respectively.

Correspondingly similar, and by a corresponding current control loop, the current which flows through the above pairs of transistors 202, 203 and 201, 204, respectively, which serve to couple out respective signals from the circuit arrangement 100, also is controlled such that it is IQ2−IQ1.

In an exemplary embodiment, the above (constant or substantially constant) biasing voltage U_ref_gain (voltage sources 252 and 255, respectively) may be provided by a (circuit) configuration working at the same or substantially the same current level as the above current control loops, but through which no signal current (such as the above input signal current I_in) flows.

Hence, it is ensured that the biasing voltage U_ref_gain is the same or substantially the same as a voltage at a node 703 ("gain" voltage) (i.e., the voltage at the drain of the transistor 105, the drain of the transistor 228, and the gates of the transistors 101, 201) if no input signal current I_in is fed to the circuit arrangement 100. Further, it is ensured that the transistors 101 and 104, the transistors 102 and 103, the transistors 201 and 204, and the transistors 202 and 203 have the same/a constant current density, even when switching between respective frequency bands (see below).

The transconductance of a field effect transistor, in particular, a MOS field effect transistor is as follows (equation 1):

$$g_m = \sqrt{2\mu C_{ox} \frac{W}{L} I_D}$$

Hence, as follows from this equation, due to the above same/constant current density through the transistors 101, 104, and 102, 103, and 201, 204, and 202, 203, respectively, by changing the transistor width W, the transconductance gm may be linearly controlled, as by changing the transistor width W, also, the drain current $I_D$ is changed. A condition for the above-said is that the transistors all have the same or substantially the same length L, which generally is the case.

As an example, and as is illustrated in FIG. 1, the transistor 101 alone works at e.g., a transconductance of n×gm1. Together/in parallel with the transistor 104, the transistors 101, 104 work at the above (total/effective) transconductance of gm1, as the transistor 104 alone as also illustrated in FIG. 1 works at e.g., a transconductance of (1−n)×gm1, and the ratio between the width of the transistor 101 and the total width of the transistors 101, 104 is n (with n<1). For instance, the width of the transistor 101 may be 3 μm, and the width of the transistor 104 may be 7 μm, and the total width of the transistors 101, 104 may hence be 10 μm. In this case, the transistor 101 alone works at e.g., a transconductance of 30% of the (total/effective) transconductance of the transistors 101, 104 working together/in parallel.

The same applies to the above transistors 201, 204, whereby as also illustrated in FIG. 1, the transistor 201 alone also works at e.g., the above transconductance of n×gm1, and the transistor 204 alone also works at e.g., a transconductance of (1−n)×gm1, such that (also) the transistors 201 and 204 together/in parallel work at the above (total) transconductance of gm1.

Further, and as also illustrated in FIG. 1, the transistor 102 alone works at e.g., a transconductance of n×gm2. Hence, together/in parallel with the transistor 103, the transistors 102, 103 work at the above (total) transconductance of gm2, as the transistor 103 alone as also illustrated in FIG. 1 works at e.g., a transconductance of (1−n)×gm2.

The same e.g., applies to the above transistors 202, 203, whereby as also illustrated in FIG. 1, the transistor 202 alone works at e.g., the above transconductance of n×gm2, and the transistor 203 alone works at e.g., a transconductance of (1−n)×gm2, such that (also) the transistors 202 and 203 together/in parallel work at the above (total) transconductance of gm2.

If the circuit arrangement 100 is to be operated in a second frequency band different from the above first frequency band, and including relatively low frequencies ("low frequency band"), the (total/effective) transconductance of active devices, e.g., transistors in the circuit arrangement 100 may be adjusted, e.g., may be made lower.

For this purpose, e.g., the switches 402, 403, 501, 503 are opened, and the switches 401, 502 are closed.

Hence, the gate of the n-channel field effect transistor 104 is connected to the above (constant or substantially constant) biasing voltage U_ref_gain (voltage source 252). Correspondingly similar, the gate of the n-channel field effect transistor 204 is connected to the above (constant or substantially constant) biasing voltage U_ref_gain (voltage source 255).

As said above, the biasing voltage U_ref_gain is the same or substantial the same as the dc voltage at the node 703 ("gain" voltage).

Hence, the transistors 104, 204 represent a current bank with constant current density above the transistors; the level of the dc voltage at the node 703 ("gain" voltage) is not influenced by the above switching (i.e., the switching from the above "high frequency band" to the above "low frequency band", and vice versa, by the above opening/closing of the switches 402, 403, 501, 503 and 401, 502, as explained above).

After switching to the above "low frequency band" operation, the same dc current flows through the transistors 104, 103, 204, 203 as before, i.e., during the operation of the circuit arrangement 100 in the above "high frequency band", but without a signal current (i.e., a respective ac current, in particular, e.g., the above input signal current I_in).

Further, after switching to the above "low frequency band" operation, the same dc current flows through the transistors 101, 102, 201, 202 as before, i.e., during the operation of the circuit arrangement 100 in the above "high frequency band", but in addition, again (as in the "high frequency band"), the signal current (i.e., a respective ac current, in particular, e.g., the above input signal current I_in).

However, the transistors 101, 102, 201, 202 as becomes clear from what was explained above now operate at a reduced (effective) transconductance, here: at a transconductance e.g., reduced by the above factor n.

For example, the transistors 101, 201 during the above "low frequency band" operation e.g., work at a transconductance of n×gm1 (instead of at an effective transconductance of gm1 as during the above "high frequency band" operation).

Further, the transistors 102, 202 during the above "low frequency band" operation e.g., work at a transconductance of n×gm2 (instead of at an effective transconductance of gm2 as during the above "high frequency band" operation).

By the circuit arrangement 100, a low pass is formed having a complex-conjugated double pole, and an adjustable (positive or negative) zero point.

The resonance frequency of the double pole results as follows (for the "high frequency band" operation):

$$f_0 = \frac{1}{2\pi}\sqrt{\frac{gm1 gm2}{C1(C2+C3)}}$$

and the attenuation (also for the "high frequency band" operation) as follows:

$$\zeta = \frac{1}{2}\sqrt{\frac{gm2 C1}{gm1(C2+C3)}}$$

Further, the positive/negative zero point results as follows (for the "high frequency band" operation):

$$f_0 = \frac{gm2}{2\pi(C2+C3-kR1 gm2 C3)}$$

Hence, by suitably choosing the above amplifying factor k of the amplifier device 301 to be positive or negative, the zero point frequency may be correspondingly chosen to be positive or negative, such that the total transfer function of the filter may be chosen such that the filter effects a respective phase lead (in the case of a positive zero point) or a respective a phase lag (in the case of a negative zero point).

In an alternative variant of the circuit arrangement 100 illustrated in FIG. 1, the transistors provided there may—instead as in the above-explained embodiment in NMOS or PMOS technology—e.g., also be designed in bipolar or BiCMOS technology. Alternatively, a complementary circuit implementation is, for instance, also conceivable, in which PMOS transistors are used instead of NMOS transistors, and vice versa NMOS transistors instead of PMOS transistors.

Figure 2:
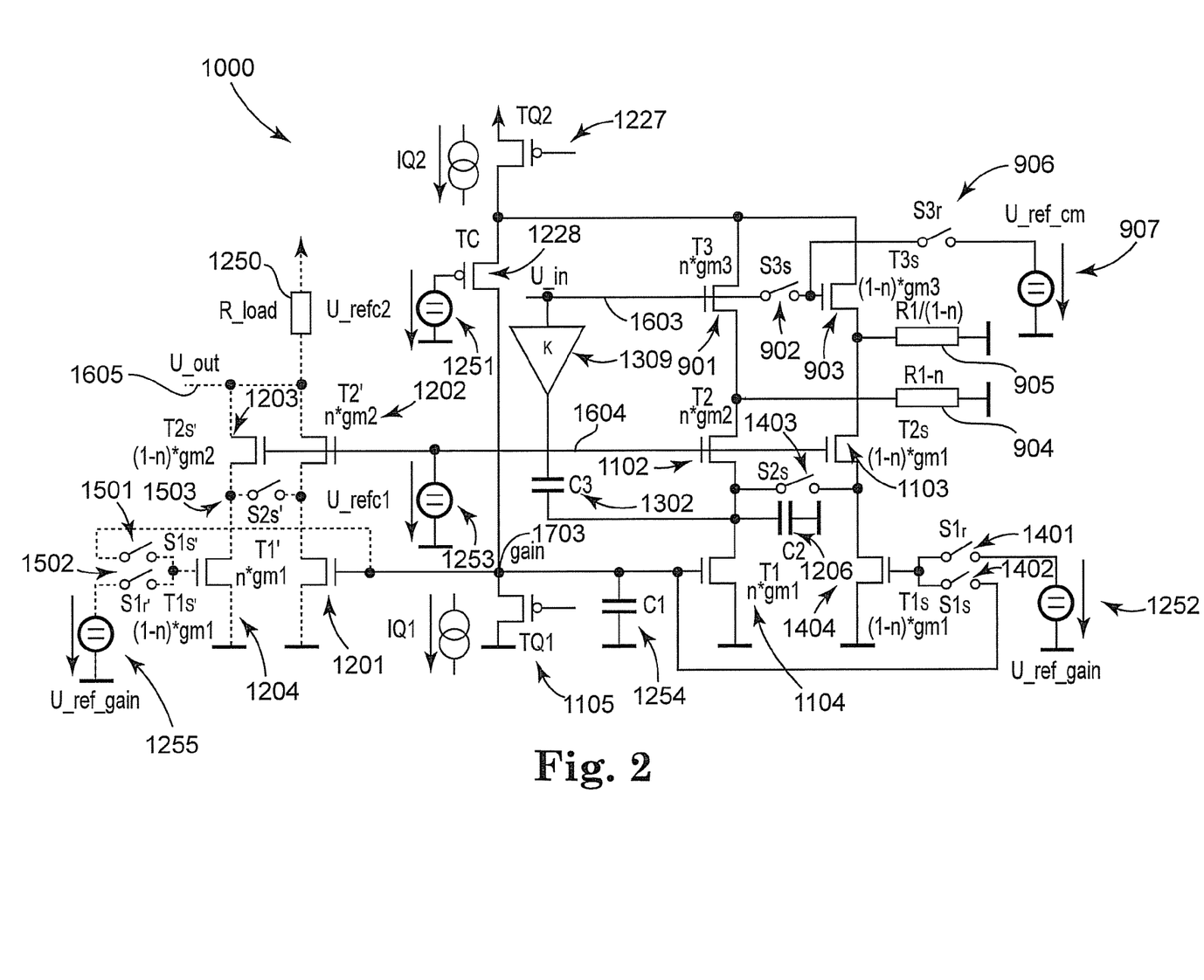
FIG. 2 illustrates a schematic, exemplary representation of a filter circuit arrangement in accordance with an alternative embodiment of the invention.

FIG. 2 illustrates a schematic, exemplary representation of a filter circuit arrangement 1000 in accordance with an alternative embodiment of the invention.

As results from FIG. 2, the filter circuit arrangement 1000 includes a plurality of n-channel field effect transistors 1101, 1102, 1103, 1104, 1105, 901, 903 and—optionally—1201, 1202, 1203, 1204.

Further, the filter circuit arrangement 1000 includes several p-channel field effect transistors 1227, 1228, a plurality of capacitors 1254, 1206, 1302, a plurality of resistors 904, 905, and a linear amplifier device 1301.

In addition, and as will be described in further detail below, the filter circuit arrangement 1000 includes a plurality of switches 1401, 1402, 1403, 1501, 1502, 1503, 902, 906.

As is illustrated in FIG. 2, the drain of the n-channel field effect transistor 1102 is connected to the source of the n-channel field effect transistor 901, and—via the resistor 904—is connected to ground.

Further, the drain of the n-channel field effect transistor 1103 is connected to the source of the n-channel field effect transistor 903, and—via the resistor 905—is connected to ground.

Still further, the drain of the n-channel field effect transistor 901 and the drain of the n-channel field effect transistor 903 are connected with the drain of the p-channel field effect transistor 1227, and with the source of the p-channel field effect transistor 1228.

The gate of the n-channel field effect transistor 903 is connected to the first connection of the switch 902, and to the first connection of the switch 906, the second connection of which is biased to a voltage U_ref_cm by a voltage source 907.

Further, the gate of the n-channel field effect transistor 901 is connected to the second connection of the switch 902, and to a line 1603, which is connected to an input of the amplifier device 1301.

As is further illustrated in FIG. 2, the source of the p-channel field effect transistor 1227 is connected to a supply voltage.

The drain of the p-channel field effect transistor 1228 is connected with the drain of the n-channel field effect transistor 1105, the source of which is connected to ground.

Further, the drain of the n-channel field effect transistor 1105 is connected with the gate of the n-channel field effect transistor 1201, the gate of the n-channel field effect transistor 1101, and the capacitor 1254, which is also connected to ground.

As is also illustrated in FIG. 2, the source of the n-channel field effect transistor 1102 is connected with the drain of the n-channel field effect transistor 1101, the capacitor 1302, the first connection of the switch 1403, and the capacitor 1206, which also is connected to ground.

Further, the source of the n-channel field effect transistor 1103 is connected with the drain of the n-channel field effect transistor 1104, and to the second connection of the switch 1403.

The gate of the n-channel field effect transistor 1104 is connected to the first connection of the switch 1401, and to the first connection of the switch 1402. Further, the source of the n-channel field effect transistor 1104 is connected to ground. Correspondingly similar, the source of the n-channel field effect transistor 1101 is connected to ground.

The second connection of the switch 1402 is connected to the gate of the n-channel field effect transistor 1101, and hence, also to the capacitor 1254, the drains of the field effect transistors 1105, 1228, and the gate of the field effect transistor 1201.

In addition, the second connection of the switch 1401 is biased to a voltage U_ref_gain by a voltage source 1252.

Further, the capacitor 1302 is connected to an output of the linear amplifier device 1301, the input of which is connected to the line 1603 (here: a respective voltage input line 1603).

As is further illustrated in FIG. 2, the gate of the n-channel field effect transistor 1103 is connected to the gate of the n-channel field effect transistor 1102, which via a line 1604 is connected to the gate of the n-channel field effect transistor 1202, and to the gate of the n-channel field effect transistor 1203.

In addition, the line 1604 is biased to a voltage U_refc1 by a voltage source 1253. Furthermore, the gate of the p-channel field effect transistor 1228 is biased to a voltage U_refc2 by a voltage source 1251.

As is also illustrated in FIG. 2, the source of the n-channel field effect transistor 1202 is connected with the drain of the n-channel field effect transistor 1201, and to the first connection of the switch 1503.

Further, the source of the n-channel field effect transistor 1203 is connected with the drain of the n-channel field effect transistor 1204, and to the second connection of the switch 1503.

The gate of the n-channel field effect transistor 1204 is connected to the first connection of the switch 1501, and to the first connection of the switch 1502. Further, the source of the n-channel field effect transistor 1204 is connected to ground. Correspondingly similar, the source of the n-channel field effect transistor 1201 is connected to ground.

The second connection of the switch 1501 is connected to the gate of the n-channel field effect transistor 1201, and hence, also to the capacitor 1254, the drains of the field effect transistors 1105, 1228, and the gate of the field effect transistor 1101.

In addition, the second connection of the switch 1502 is biased to the voltage U_ref_gain by a voltage source 1255.

Further, the drain of the n-channel field effect transistor 1202 is connected to the drain of the n-channel field effect transistor 1203. In addition, the drain of the n-channel field effect transistor 1202 and the drain of the n-channel field effect transistor 1203 are connected with a voltage output line 1605, and via a load resistor 1250 to the above supply voltage.

As is illustrated in FIG. 2, by use of the filter circuit arrangement 1000, an input voltage U_in fed to the filter circuit arrangement 1000 at the above voltage input line 1603, and representing the input of the filter circuit arrangement 1000 is converted into a respective output voltage U_out that can be tapped at the above voltage output line 1605, and representing the output of the filter circuit arrangement 1000.

In the filter circuit arrangement 1000, the p-channel field effect transistor 1228 serves as a cascode to keep the node connected with the drains of the n-channel field effect transistors 901, 903 on a predefined potential.

Further, the p-channel field effect transistor 1227 acts as a current source (current IQ2). Such a current source may in alternative embodiments be designed differently than illustrated in FIG. 2.

As results further from FIG. 2, the n-channel field effect transistor 1105 acts as a current sink (current IQ1). A current sink as provided by the transistor 1105 may in alternative embodiments be designed differently than illustrated in FIG. 2.

As becomes clear from what was said above, the above transistors 1201, 1202, 1203, 1204 e.g., serve to couple out respective signals from the circuit arrangement 1000, in particular, e.g., the above output voltage U_out.

The circuit arrangement 1000 may be operated in several different frequency bands.

If the circuit arrangement 1000 is to be operated in a first frequency band including relatively high frequencies ("high frequency band"), the (total/effective) transconductance of active devices, e.g., transistors in the circuit arrangement 1000 may be adjusted, e.g., may be made higher.

For this purpose, e.g., the switches 1402, 1403, 902, 1501, 1503 are closed, and the switches 1401, 1502, 906 are opened.

In this case, the n-channel field effect transistors 1101, 1104, as well as the n-channel field effect transistors 1102, 1103, as well as the n-channel field effect transistors 1201, 1204, the n-channel field effect transistors 1202, 1203, as well as the n-channel field effect transistors 901, 903 are connected in parallel, respectively.

Hence, the n-channel field effect transistor 1101 together with the n-channel field effect transistor 1104 has a (total/effective) transconductance of gm1. Correspondingly similar, also, the n-channel field effect transistor 1201 together with the n-channel field effect transistor 1204 has a (total/effective) transconductance of gm1. Further, the n-channel field effect transistor 1102 together with the n-channel field effect transistor 1103 has a (total/effective) transconductance of gm2. Correspondingly similar, also, the n-channel field effect transistor 1202 together with the n-channel field effect transistor 1203 has a (total/effective) transconductance of gm2. Further, the n-channel field effect transistor 901 together with the n-channel field effect transistor 903 has a (total/effective) transconductance of gm3.

The current control loop e.g., including the transistor 1101 in parallel to the transistor 1104, the transistor 1102 in parallel to the transistor 1103, the transistor 901 in parallel to the transistor 903, the resistor 905 (having a resistance of R1/(n−1)), the resistor 904 (having a resistance of R1/n), the above cascode transistor 1228, the above current sink (current IQ1), and the above current source (current IQ2) controls the current through the transistor 1101 in parallel to the transistor 1104, the transistor 1102 in parallel to the transistor 1103, and the transistor 901 in parallel to the transistor 903 so that a current of IQ2−IQ1 flows through the respective pairs of transistors 1102, 1103, 1101, 1104, 901, 903.

Correspondingly similar, and by a corresponding current control loop, the current which flows through the above pairs of transistors 1202, 1203 and 1201, 1204, respectively, which as said e.g., serve to couple out respective signals from the circuit arrangement 1000, also is controlled such that it is IQ2−IQ1.

In an exemplary embodiment, the above (constant or substantially constant) biasing voltage U_ref_gain (voltage sources 1252 and 1255, respectively) may be provided by a (circuit) configuration working at the same or substantially the same current level as the above current control loops, but through which no signal current flows.

Hence, it is ensured that the biasing voltage U_ref_gain is the same or substantial the same as a voltage at a node 1703 ("gain" voltage) (i.e., the voltage at the drain of the transistor 1105, the drain of the transistor 1228, and the gates of the transistors 1101, 1201) if no input signal (such as the above input voltage U_in) is fed to the circuit arrangement 1000. Further, it is ensured that the transistors 1101 and 1104, the transistors 1102 and 1103, the transistors 1201 and 1204, the transistors 1202 and 1203, and the transistors 901, 903 have the same/a constant current density, even when switching between respective frequency bands (see below).

The transistor 1101 alone works at e.g., a transconductance of n×gm1. Together/in parallel with the transistor 1104, the transistors 1101, 1104 work at a (total/effective) transconductance of gm1, as the transistor 1104 alone as illustrated in FIG. 2 works at e.g., a transconductance of (1−n)×gm1, and the ratio between the width of the transistor 1101 and the total width of the transistors 1101, 1104 is n (with n<1). For instance, the width of the transistor 1101 may be 3 μm, and the width of the transistor 1104 may be 7 μm, and the total width of the transistors 1101, 1104 may hence be 10 μm. In this case, the transistor 1101 alone works at e.g., a transconductance of 30% of the (total/effective) transconductance of the transistors 1101, 1104 working together/in parallel.

The same e.g., applies to the above transistors 1201, 1204, as also illustrated in FIG. 2, the transistor 1201 alone also works at e.g., the above transconductance of n×gm1, and the transistor 1204 alone also works at e.g., a transconductance of (1−n)×gm1, such that (also) the transistors 1201 and 1204 together/in parallel work at the above (total) transconductance of gm1.

Further, and as also illustrated in FIG. 2, the transistor 1102 alone works at e.g., a transconductance of n×gm2. Hence, together/in parallel with the transistor 1103, the transistors 1102, 1103 work at a (total) transconductance of gm2, as the transistor 1103 alone as also illustrated in FIG. 2 works at e.g., a transconductance of (1−n)×gm2.

The same e.g., applies to the above transistors 1202, 1203, whereby as also illustrated in FIG. 2, the transistor 1202 alone works at e.g., the above transconductance of n×gm2, and the transistor 1203 alone works at e.g., a transconductance of (1−n)×gm2, such that (also) the transistors 1202 and 1203 together/in parallel work at the above (total) transconductance of gm2.

Figure 3:
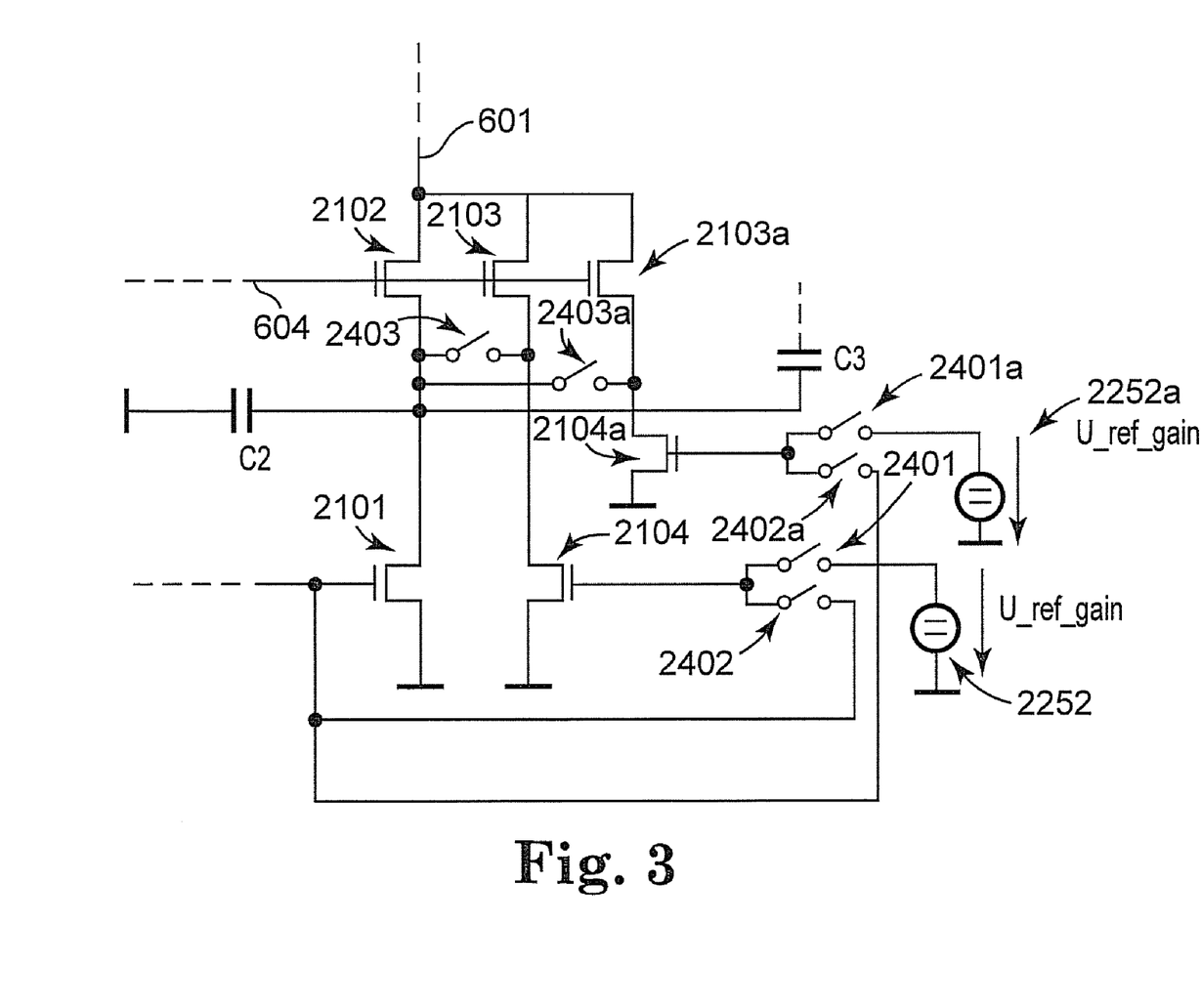
FIG. 3 illustrates a schematic, exemplary representation of a portion of a filter circuit arrangement in accordance with an alternative embodiment of the arrangement illustrated in FIG. 1.

Still further, and as also illustrated in FIG. 2, the transistor 901 alone works at e.g., a transconductance of n×gm3. Hence, together/in parallel with the transistor 903, the transistors 901, 903 work at a (total) transconductance of gm3, as the transistor 903 alone as also illustrated in FIG. 3 works at e.g., a transconductance of (1−n)×gm3.

If the circuit arrangement 1000 is to be operated in a second frequency band different from the above first frequency band, and including relatively low frequencies ("low frequency band"), the (total/effective) transconductance of active devices, e.g., transistors in the circuit arrangement 1000 may be adjusted, e.g., may be made lower.

For this purpose, e.g., the switches 1402, 1403, 902, 1501, 1503 are opened, and the switches 1401, 1502, 906 are closed.

Hence, the gate of the n-channel field effect transistor 1104 is connected to the above (constant or substantially constant) biasing voltage U_ref_gain (voltage source 1252). Correspondingly similar, the gate of the n-channel field effect transistor 1204 is connected to the above (constant or substantially constant) biasing voltage U_ref_gain (voltage source 1255).

As said above, the biasing voltage U_ref_gain is the same or substantial the same as the dc voltage at the node 1703 ("gain" voltage).

Hence, the transistors 1104, 1204 represent a current bank with constant current density above the transistors; the level of the dc voltage at the node 1703 ("gain" voltage) is not influenced by the above switching (i.e., the switching from the above "high frequency band" to the above "low frequency band", and vice versa, by the above opening/closing of the switches 1402, 1403, 902, 1501, 1503 and 1401, 1502, 906 as explained above).

After switching to the above "low frequency band" operation, the same dc current flows through the transistors 1104, 1103, 903, 1204, 1203 as before, i.e., during the operation of the circuit arrangement 1000 in the above "high frequency band", but without a signal current.

Further, after switching to the above "low frequency band" operation, the same dc current flows through the transistors 1101, 1102, 901, 1201, 1202 as before, i.e., during the operation of the circuit arrangement 1000 in the above "high frequency band", but in addition, again (as in the "high frequency band"), the signal current.

However, the transistors 1101, 1102, 901, 1201, 1202 as becomes clear from what was explained above now operate at a reduced (effective) transconductance, here: at a transconductance e.g., reduced by the above factor n.

For example, the transistors 1101, 1201 during the above "low frequency band" operation e.g., work at a transconductance of n×gm1 (instead of at an effective transconductance of gm1 as during the above "high frequency band" operation).

Further, the transistors 1102, 1202 during the above "low frequency band" operation e.g., work at a transconductance of n×gm2 (instead of at an effective transconductance of gm2 as during the above "high frequency band" operation).

Still further, the transistor 901 during the above "low frequency band" operation e.g., works at a transconductance of n×gm3 (instead of at an effective transconductance of gm3 as during the above "high frequency band" operation).

The voltage U_ref_cm provided by the voltage source 907 corresponds to the (static) dc voltage at the gate of the transistor 901 when no input signal is present. Hence, by the resistors 904, 905 the respective dc current is correctly adjusted, such that regardless of the state of the circuit arrangement 1000 ("high frequency band" operation, or "low frequency band" operation) the same or substantially the same voltage potential is present at the sources of the transistors 901, 903.

In order not to change the dynamic properties of the circuit arrangement 1000 whilst switching between the above frequency bands, also the resistors 904, 905 at the sources of the transistors 901, 903 are dimensioned according to the respective transistor transconductances. Hence, the resistance of the resistor 905 is chosen to be R1/(1−n), and the resistance of the resistor 904 is chosen to be R1/n. During the above "high frequency band" operation, the resistors 904, 905 are connected in parallel, such that the (total/effective) resistance of the resistors 904, 905 then is R1.

The circuit arrangement 1000 illustrated in FIG. 2 (and also the circuit arrangement 100 illustrated in FIG. 1) may according to further alternative variants be constructed "differentially". In this case, e.g., the resistors 904, 905 may not be connected to ground. Instead, the resistors 904, 905 may then e.g., be connected with each other.

By the circuit arrangement 1000, a low pass is formed having a complex-conjugated double pole, and an adjustable (positive or negative) zero point.

The resonance frequency of the double pole results as follows (for the "high frequency band" operation):

$$f_0 = \frac{1}{2\pi}\sqrt{\frac{gm1\,gm2\,gm3\,R1}{C1(C2+C3)(1+gm3R1)}}$$

and the attenuation (also for the "high frequency band" operation) as follows:

$$\zeta = \frac{1}{2}\sqrt{\frac{gm2\,C1(1+gm3R1)}{gm1(C2+C3)gm3R1}}$$

Further, the positive/negative zero point results as follows (for the "high frequency band" operation):

$$f_0 = \frac{gm2}{2\pi(C2+C3-kR1gm2C3)}$$

Hence, by suitably choosing the above amplifying factor k of the amplifier device 1301 to be positive or negative, the zero point frequency may be correspondingly chosen to be positive or negative, such that the total transfer function of the filter may be chosen such that the filter effects a respective phase lead (in the case of a positive zero point) or a respective a phase lag (in the case of a negative zero point).

In an alternative variant of the circuit arrangement 1000 illustrated in FIG. 2, the transistors provided there may—instead as in the above-explained embodiment in NMOS or PMOS technology—e.g., also be designed in bipolar or BiC-MOS technology. Alternatively, a complementary circuit implementation is, for instance, also conceivable, in which PMOS transistors are used instead of NMOS transistors, and vice versa NMOS transistors instead of PMOS transistors.

In further, alternative variants, a plurality (e.g., two, three, or more) of the filter circuit arrangements 100, 1000 illustrated in FIGS. 1 and 2 may be connected in series (cascading).

FIG. 3 illustrates a schematic, exemplary representation of a portion of a filter circuit arrangement in accordance with an alternative embodiment of the arrangement 100 illustrated in FIG. 1.

As results from FIG. 3, instead of the pair of n-channel field effect transistors 101, 104 as illustrated in FIG. 1, a first set of three transistors (three n-channel field effect transistors 2101, 2104, 2104a) is used. In addition, instead of the pair of n-channel field effect transistors 102, 103, a second set of three transistors (n-channel field effect transistors 2102, 2103, 2103a) are used.

In addition, and as will be described in further detail below, instead of the switches 401, 402, 403, the switches 2401, 2402, 2403, 2401a, 2402a, 2403a are used.

As is illustrated in FIG. 3, a first connection of the first switch 2402 is connected to a control gate of a first transistor 2104 of the first set of transistors, a second connection of the first switch 2402 is connected to a control gate of a second transistor 2101 of the first set of transistors. Further, a first connection of the second switch 2401 is connected to the control gate of the first transistor 2104 of the first set of transistors, and a second connection of the second switch 2401 is connected to a reference voltage U_ref_gain. In addition, a first connection of the third switch 2402a is connected to a control gate of a third transistor 2104a of the first set of transistors, and a second connection of the third switch 2402a is connected to the control gate of the second transistor 2101 of the first set of transistors. A first connection of the fourth switch 2401a is connected to the control gate of the third transistor 2104a of the first set of transistors, and a second connection of the fourth switch 2401a is connected to a reference voltage U_ref_gain.

In addition, and as is further illustrated in FIG. 3, a first connection of the fifth switch 2403 is connected to the first transistor 2104 of the first set of transistors and to a first transistor 2103 of the second set of transistors, and a second connection of the fifth switch 2403 is connected to the second transistor 2101 of the first set of transistors and to a second transistor 2102 of the second set of transistors. Further, a first connection of the sixth switch 2403a is connected to the third transistor 2104a of the first set of transistors and to a third transistor 2103a of the second set of transistors, and a second connection of the sixth switch 2403a is connected to the second transistor 2101 of the first set of transistors and to the second transistor 2102 of the second set of transistors.

The circuit arrangement may be operated in three different frequency bands. If the circuit arrangement is to be operated in a first frequency band including very high frequencies ("very high frequency band"), the (total/effective) transconductance of active devices, e.g., transistors in the circuit arrangement may be adjusted, e.g., may be high. For this purpose, e.g., the switches 2402, 2402a, 2403, 2403a are closed, and the switches 2401, 2401a are opened. If the circuit arrangement is to be operated in a second frequency band including high frequencies ("high frequency band"), but frequencies lower than in the "very high frequency band", the (total/effective) transconductance of active devices, e.g., transistors in the circuit arrangement may be adjusted, e.g., may be made lower. For this purpose, e.g., the switches 2402, 2401a, 2403 are closed, and the switches 2401, 2402a, 2403a are opened. If the circuit arrangement is to be operated in a third frequency band including relatively low frequencies ("low frequency band"), i.e., frequencies lower than in the "high frequency band", the (total/effective) transconductance of active devices, e.g., transistors in the circuit arrangement may again be adjusted, e.g., may be made even lower. For this purpose, e.g., the switches 2401, 2401a are closed, and the switches 2402, 2402a, 2403, 2403a are opened.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A filter circuit arrangement comprising:
    a first pair of transistors;
    a first and a second switch for switching between a first and a second frequency band operating mode;
    a first connection of the first switch being connected to a control gate of the first transistor of the first pair of transistors;
    a second connection of the first switch being connected to a control gate of the second transistor of the first pair of transistors;
    a first connection of the second switch being connected to the control gate of the first transistor of the first pair of transistors;
    a second connection of the second switch being connected to a reference voltage;
    a second pair of transistors;
    a third switch;
    a first connection of the third switch being connected to the first transistor of first pair of transistors and to the first transistor of the second pair of transistors; and
    a second connection of the third switch being connected to the second transistor of the first pair of transistors and to the second transistor of the second pair of transistors.

2. The filter circuit arrangement of claim 1, further comprising a third pair of transistors, and a fourth and a fifth switch, a first connection of the fourth switch being connected to a control gate of the first transistor of the third pair of transistors, a second connection of the fourth switch being connected to a control gate of the second transistor of the third pair of transistors, a first connection of the fifth switch being connected to the control gate of the first transistor of the third pair of transistors, and a second connection of the fifth switch being connected to a reference voltage.

3. A filter circuit arrangement comprising:
    a first set of transistors;
    a first and a second and a third and a fourth switch for switching between a first and a second and a third frequency band operating mode;
    a first connection of the first switch being connected to a control gate of a first transistor of the first set of transistors;
    a second connection of the first switch being connected to a control gate of a second transistor of the first set of transistors;
    a first connection of the second switch being connected to the control gate of the first transistor of the first set of transistors;
    a second connection of the second switch being connected to a reference voltage;
    a first connection of the third switch being connected to a control gate of a third transistor of the first set of transistors;
    a second connection of the third switch being connected to the control gate of the second transistor of the first set of transistors;
    a first connection of the fourth switch being connected to the control gate of the third transistor of the first set of transistors;
    a second connection of the fourth switch being connected to a reference voltage
    second set of transistors;
    a fifth and a sixth switch;
    a first connection of the fifth switch being connected to the first transistor of the first set of transistors and to a first transistor of the second set of transistors;
    a second connection of the fifth switch being connected to the second transistor of the first set of transistors and to a second transistor of the second set of transistors;
    a first connection of the sixth switch being connected to the third transistor of the first set of transistors and to a third transistor of the second set of transistors; and
    a second connection of the sixth switch being connected to the second transistor of the first set of transistors and to the second transistor of the second set of transistors.

* * * * *